United States Patent [19]

Janai et al.

[11] Patent Number: 5,679,967

[45] Date of Patent: Oct. 21, 1997

[54] CUSTOMIZABLE THREE METAL LAYER GATE ARRAY DEVICES

[75] Inventors: Meir L Janai; Zvi Orbach, both of Haifa, Israel

[73] Assignee: Chip Express (Israel) Ltd., Haifa, Israel

[21] Appl. No.: 407,412

[22] Filed: Mar. 17, 1995

Related U.S. Application Data

[63] Continuation-in-part of Ser. No. 290,550, Aug. 15, 1994, and Ser. No. 81,553, Jun. 23, 1993, Pat. No. 5,545,904, which is a continuation of Ser. No. 626,199, Dec. 7, 1990, abandoned, and a continuation-in-part of Ser. No. 449,063, Dec. 18, 1989, Pat. No. 4,924,287, which is a continuation of Ser. No. 311,397, Feb. 16, 1989, abandoned, which is a continuation of Ser. No. 273,706, Nov. 15, 1988, abandoned, which is a continuation of Ser. No. 819,707, Jan. 17, 1986, abandoned, said Ser. No. 626,199, is a continuation-in-part of Ser. No. 344,582, Apr. 28, 1989, Pat. No. 5,049,969, which is a continuation-in-part of Ser. No. 222,514, Jul. 21, 1988, Pat. No. 4,933,738.

[30] Foreign Application Priority Data

Jan. 20, 1985 [IL] Israel ............................................. 74108
Apr. 25, 1988 [IL] Israel ............................................. 86162

[51] Int. Cl.⁶ .................................................... H01L 27/02
[52] U.S. Cl. ................................................ 257/209; 257/259
[58] Field of Search ................................ 257/529, 202, 257/204, 209

[56] References Cited

U.S. PATENT DOCUMENTS

| | | | |
|---|---|---|---|
| 3,925,684 | 12/1975 | Gaskill | 307/203 |
| 4,124,899 | 11/1978 | Birkner . | |
| 4,197,555 | 4/1980 | Uehara . | |
| 4,233,671 | 11/1980 | Gerzberg . | |
| 4,238,839 | 12/1980 | Redfern . | |
| 4,240,094 | 12/1980 | Mader . | |
| 4,295,149 | 10/1981 | Balyoz . | |
| 4,325,109 | 4/1982 | Pander | 257/369 |
| 4,356,504 | 10/1982 | Tozun . | |
| 4,412,237 | 10/1983 | Matsumura . | |
| 4,455,495 | 6/1984 | Masuhara . | |

(List continued on next page.)

FOREIGN PATENT DOCUMENTS

| | | |
|---|---|---|
| 0112693 | 7/1984 | European Pat. Off. . |
| 0210397 | 6/1986 | European Pat. Off. . |
| 0303396 | 2/1989 | European Pat. Off. . |
| 0336026 | 10/1989 | European Pat. Off. . |
| 0243014 | 11/1989 | European Pat. Off. . |
| 61678 | 12/1980 | Israel . |
| 53-78789 | 7/1978 | Japan . |
| 60-16438 | 1/1985 | Japan . |
| 1133992 | 12/1968 | United Kingdom . |

OTHER PUBLICATIONS

N.H.E. Weste et al. "Principles of CMOS VLSI Design, A System Perspective", Addison–Wesk, (Jun. 1988) pp. 241–244, 370, 374.

North, J. et al. "Laser Coding ..." IEEE Int'l of Solid State Devices, vol. SC–11, No. 4, Aug. 1976, pp. 500–505.

Schuster, S. "Selective Metallization ..." IBM Tech Disc. Bull. vol. 15, No. 2, Jul. 1972, pp. 551–552.

Raffel, J.I. et al. "A Wafer Scale ..." IEEE, Journal of Solid State Circuits, vol. SC–20, No. 1, Feb. 1985.

(List continued on next page.)

*Primary Examiner*—J. Carroll
*Attorney, Agent, or Firm*—Ladas & Parry

[57] ABSTRACT

Three metal layer customizable gate array devices and techniques to customize them are disclosed. Such a device incorporates an integrated circuit blank having a plurality of transistors and at least three metal layers. A plurality of fusible links interconnects said plurality of transistors into an inoperable circuit. A laser ablative etch resistant coating is formed over the device. Later, the coating is ablated by laser at locations overlaying designated fuse locations. The device is then etched for selectably removing some of the fusible links, thereby converting the inoperable integrated circuit blank into an operable gate array device.

13 Claims, 16 Drawing Sheets

U.S. PATENT DOCUMENTS

| | | |
|---|---|---|
| 4,476,478 | 10/1984 | Nozuchi . |
| 4,536,949 | 8/1985 | Takayama . |
| 4,590,589 | 5/1986 | Gerzberg . |
| 4,651,190 | 3/1987 | Suzuki . |
| 4,677,452 | 6/1987 | Zommer . |
| 4,700,214 | 10/1987 | Johnson . |
| 4,758,745 | 7/1988 | Elganal . |
| 4,795,720 | 1/1989 | Kawanabe . |
| 4,924,287 | 5/1990 | Orbach . |

OTHER PUBLICATIONS

Disclosed Figures BA–1, BA–2, and BA–3 of U.S. Pat. No. 5,049,969.

C.J. Boisuert, "One Day Prototype Laser . . . ", 8079 Electro/86αMini/Micro Northeast, 11 (1986) Conference Record, Los Angeles CA US. pp. 1–4.

R.M. Fisher, "Nonvolatile Memories" IEEE International Solid State Circuits Conference, vol. 25, Feb. 1982, NY USA pp. 114–115.

Ono, K "A Method for Producing a Semiconductor for Integrated Circuit", Kokai JP 53–78789 Japan (English Translation).

CUSTOMIZABLE THREE METAL LAYER GATE ARRAY DEVICES

RELATED APPLICATIONS

This application is a continuation-in-part of U.S. patent application Ser. No. 08/081,553 filed Jun. 23, 1993 U.S. Pat. No. 5,545,904, which is a continuation of U.S. patent application Ser. No. 07/626,199 filed Dec. 7, 1990, abandoned, which is a continuation-in-part of application Ser. No. 07/344,582, filed Apr. 28, 1989, issued as U.S. Pat. No. 5,049,969, which is a continuation-in-part of U.S. patent application Ser. No. 07/222,514, filed Jul. 21, 1988, issued as U.S. Pat. No. 4,933,738. Application Ser. No. 08/081,553 is also a continuation-in-part of U.S. patent application Ser. No. 07/449,063, filed Dec. 18, 1989, issued as U.S. Pat. No. 4,924,287, which is a continuation of U.S. patent application Ser. No. 07/311,397, filed Feb. 16, 1989, abandoned, which is a continuation of U.S. patent application Ser. No. 07/273,706, filed Nov. 15, 1988, abandoned, which is a continuation of U.S. patent application Ser. No. 06/819,707, filed Jan. 17, 1986, abandoned. This application is also a continuation in part of U.S. patent application Ser. No. 08/290,550 filed Aug. 15, 1994, pending.

FIELD OF THE INVENTION

The present invention relates to semiconductor devices generally and more particularly to customizable semiconductor devices and to techniques for fabricating them.

BACKGROUND OF THE INVENTION

Integrated circuits are electronic circuits that normally include many semiconductor elements, such as transistors and diodes, as well as other electronic components, in highly compact form, on a semiconductor material, such as a silicon wafer. The basic principle underlying integrated circuits is that instead of building an electronic circuit out of discrete components such as transistors, diodes, resistors and capacitors, the entire circuit is fabricated on the same piece of silicon in several superimposed layers of conducting, insulating and transistor forming materials. By forming predetermined isolated and interconnected geometric shapes in each of these layers, a circuit having a required function is realized.

The process by which an integrated circuit is fabricated is long and complex and usually includes the formation of at least 12 different layers. Generally, the lowest seven layers define the transistors and are known as active areas. In CMOS technology a transistor comprises a well, field oxide, p or n type implanted semiconductor regions and a conducting gate over a thin oxide layer separating the implanted regions from the conducting gate.

The upper layers of the integrated circuit generally define interconnecting links between active areas and insulating materials between the layers of interconnections and between the interconnections and the active areas. A two layer interconnection schema thus contains two metal layers and three insulation layers. A three layer interconnection schema contains three metal layers and four insulation layers, and so on. A plurality of holes, called vias, is formed in the insulation layers that separate adjacent metal layers, these vias connect between metal links in different layers.

All the layers are defined by photolithographic techniques using masks.

As is readily appreciated, the above process requires sophisticated machinery and custom masks which must be specially designed and manufactured for each specific type of custom integrated circuit to be fabricated. For the process to be at all economical, extremely large quantities of integrated circuits must be produced for a given design. For applications in which the desired quantities of a specific circuit are not extremely large, techniques have been developed for producing integrated circuits known as gate arrays. In these gate arrays, many transistors and other components are produced by the above-described mass production techniques. Specific interconnections therebetween suitable for a specific device are then formed on the chip by customizing only suitable metal layers thereon.

Electronic systems manufactured by combining a large number of standard integrated circuit devices have several disadvantages:

a. Many printed circuit boards are required, resulting in an expensive product, relatively long assembly time, relative difficulty in maintenance and troubleshooting and large size.

b. Lower electrical power efficiency is realized. As a result, relatively larger power sources are required and heavier and larger products result.

There are known integrated circuits such as EPROMS and PALS (programmable array logic) which are programmed by current fusing via the integrated circuit's input/output pins. These circuits require elaborate extra fusing circuitry for this purpose.

There are also known techniques to increase the yield of integrated circuit production by excising inoperative portions of circuits by fusing. These techniques are normally preformed on wafers including a multiplicity of integrated circuits.

It is also known to produce gate arrays which are laser programmable. An example of such a device is described in a publication of Laserpath, Inc. of Sunnyvale, Calif. 94086 USA entitled "One Day Prototype Laser Programmed Arrays" dated Feb. 26, 1986.

Dual metal layer integrated circuit technology for customizable integrated circuits has been developed in recent years to enable automatic computer software controlled generation of integrated circuit layouts, commonly known as routing. In the early years of integrated circuit development, routing was done by hand. Due to the increased complexity and density of contemporary integrated circuits, manual routing is no longer feasible.

Dual metal layer technology provides two independent routing layers extending in respective perpendicular directions, a vertical direction, commonly termed North-South and a horizontal direction, commonly termed East-West. Changes in direction are provided by vias which interconnect the two layers. The vias are typically defined by an opening in the insulating layer separating the two metal layers filled by metal from one of the layers. FIG. 1A shows a simple dual metal layout wherein vias are positioned at the locations of the desired direction changes. The horizontal strips are typically a metal layer, indicated as M1, and the vertical strips are typically a metal layer, indicated as M2. The M2 layer overlies the M1 layer.

In order to allow rapid customization of dual metal type integrated circuits, it is desired that such customization be produced solely by fuse disconnection rather than by applying metal across a gap. FIG. 1B shows a portion of a pre-configured integrated circuit called a blank. Configurations such as shown in FIG. 1B were developed to combine the advantages of automatic routing with those of rapid customization, such that customization can be carried out utilizing an automatic routing technique. In the configuration of FIG. 1B the North-South strips are indicated to be in layer M2 while the East-West strips are indicated to be in layer M1. A via connecting the M1 and M2 layers is disposed adjacent each crossing of the respective M1 and M2 strips. The via underlies the M2 strip and is joined to the M1 strip by means of a branch having a fuse (indicated by a rectangle) formed thereon. Fuses are also provided along the M2 strips between a via and the crossing of the respective M1 and M2 strips and along the M1 strips between adjacent branches.

Customization of the blank shown in FIG. 1B is achieved by fusing all fuses on the branches that are not designated to carry current. Typically, the current travels in straight lines (along the metal strips). If a direction change is needed, a branch is used to establish a connection to a different metal layer (which typically has metal strips perpendicular to the first metal strip). Additionally, all the fuses along the metal strip in portions wherein no current flow is designated are fused. For example, for electric current traveling along an M1 strip, if the desired direction of current flow along the strip is South, the fuses lying to the North of the entry of the current to the strip are fused. FIG. 1C illustrates a circuit equivalent to that shown in FIG. 1A embodied in the structure of FIG. 1B, where /'s (slashes) over fuses in FIG. 1C indicate fuses which are fused.

A customizable CMOS gate array device which is disclosed in U.S. Pat. No. 5,545,904 has two metal layers and a plurality of transistors. The metal layers are initially etched during manufacture of the blank to form links which interconnect the transistors in a way which creates an inoperable circuit. A plurality of fuse locations is designated on links in both metal layers, such that when selected ones of them are fused, the inoperable circuit is transformed to a specific operating circuit. At locations where fusing links is desired, apertures are formed over the designated fuse locations.

It is known in the art to customize a customizable CMOS gate array circuit blank having two metal layers using at least one of the following methods:

(a) fusing links with electric current;
(b) fusing links with a laser beam;
(c) etching selected links in both metal layers at once by:
 1. forming apertures over the fuses;
 2. laying down a layer of photo-resist;
 3. selectively developing the photo-resist, using a mask;
 4. etching the links; and
 5. removing any remaining photo-resist; or
(d) covering the circuit blank with a laser ablative etch-resistant layer, ablating the layer with a laser at selected fuse locations and etching the ablated portions of the circuit in order to fuse the links.

U.S. Pat. No. 4,197,555 to Uehara describes a structure in which a relatively long strip M1 is used. Although this structure is adequate for PAL configuration applications, it is relatively unsuitable for gate array applications, particularly if an automatic place-and-route program is used. Also, the length of the M1 strip acts to increase the line capacitance. High density, efficient gate-array devices require fuses in at least two interconnect layers.

Various customizable logic array devices are known in the patent literature. Applicant/assignee's U.S. Pat. Nos. 4,924,287; 4,875,971; 4,933,738; 5,049,969; 5,260,597 and 5,111,273 describe apparatus and methods that have found commercial acceptance. Other relevant prior art is referenced therein.

Various types of field-programmable gate arrays are known in the art. A review of the state of the art in field-programmable gate arrays appears in the *Field-Programmable Gate Arrays*, by Brown et al., Kluwer Academic Publishers, 1992.

The following U.S. Patents describe customizable devices including an array of multiple input, function selectable logic cells: U.S. Pat. Nos. 4,197,555; 4,240,094; 4,873,459; 4,910,417; 5,132,571; 5,172,014; 5,198,705 and 5,223,792.

SUMMARY OF THE INVENTION

The present invention seeks to provide selectably customizable CMOS gate array devices, having three metal layers, which are suitable for prototype and small scale production and are compact and thus compatible with high-density architecture used in CMOS gate array technology.

The present invention also seeks to provide a method of customizing a triple metal layer gate array circuit blank which includes covering the entire circuit blank with an etch-resistant laser ablative coating. Later, when customization is desired, the coating is ablated with a laser at selected fuse locations and the circuit is etched to remove the fuses underlying the ablated locations to complete the customization process.

There is therefore provided, in accordance with a preferred embodiment of the invention, a method of customizing an integrated circuit device comprising:

providing a device comprising:
 a substrate;
 a plurality of transistors provided on said substrate;
 at least three interconnected metal layers, separated by layers of insulation; and
 a plurality of links connecting the transistors into an inoperable circuit, at least some of said plurality of links having designated fuse locations in at least two of said three metal layers, said plurality of links and transistors being arranged such that, upon disconnecting of selected ones of said plurality of links at ones of said designated fuse locations, said plurality of links and transistors is interconnected into an operable circuit, wherein said fuse locations are not selectively fusible by current supplied at accessible input/output pins of the device; and subsequently modifying at least the center one of said three metal layers, at at least some of said fuse locations.

Further in accordance with a preferred embodiment of the invention, there is provided a method of customizing an integrated circuit device comprising:

providing a device comprising:
 a substrate;
 a plurality of transistors provided on said substrate;
 at least three interconnected metal layers, separated by layers of insulation; and
 a plurality of links connecting the transistors into an inoperable circuit, at least some of said plurality of links having designated fuse locations in at least two of said three metal layers, said plurality of links and transistors being arranged such that, upon disconnecting of selected ones of said plurality of links at ones of said designated fuse locations, said plurality of links and transistors is interconnected into an operable circuit; and subsequently fusing at least some of said fuse locations in at least the center one of said three metal layers with a laser.

Further in accordance with another preferred embodiment of the invention, there is provided a method of customizing an integrated circuit device comprising:

providing a device comprising:

a substrate;

a plurality of transistors provided on said substrate;

at least three interconnected metal layers, separated by layers of insulation; and a plurality of links connecting the transistors into an inoperable circuit, at least some of said plurality of links having designated fuse locations in at least two of said three metal layers, said plurality of links and transistors being arranged such that, upon disconnecting of selected ones of said plurality of links at ones of said designated fuse locations, said plurality of links and transistors is interconnected into an operable circuit; and subsequently etching at least some of said fuse locations in at least the center one of said three metal layers.

Further in accordance with yet another preferred embodiment of the invention, there is provided a method of customizing an integrated circuit device comprising:

providing a device comprising:

a substrate;

a plurality of transistors provided on said substrate;

at least three interconnected metal layers, separated by layers of insulation; and a plurality of links connecting the transistors into an inoperable circuit, at least some of said plurality of links having designated fuse locations in at least two of said three metal layers, said plurality of links and transistors being arranged such that, upon disconnecting of selected ones of said plurality of links at ones of said designated fuse locations, said plurality of links and transistors is interconnected into an operable circuit;

providing a radiation sensitive coating over at least one of the metal layers; and subsequently modifying at least the center one of said three metal layers at at least some of said fuse locations.

Further in accordance with a further preferred embodiment of the invention, there is provided a customizable integrated circuit device comprising:

a substrate;

a plurality of transistors provided on said substrate;

at least three interconnected metal layers, separated by layers of insulation; and a plurality of links connecting the transistors into an inoperable circuit, said plurality of links having designated fuse locations in at least two of said three metal layers, said plurality of links and transistors being arranged such that, upon disconnecting of predetermined ones of said plurality of links at ones of said designated fuse locations, said plurality of links and transistors is interconnected into an operable circuit, wherein said fuse locations are not selectively fusible by current supplied at accessible input/output pins of the device.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1A:
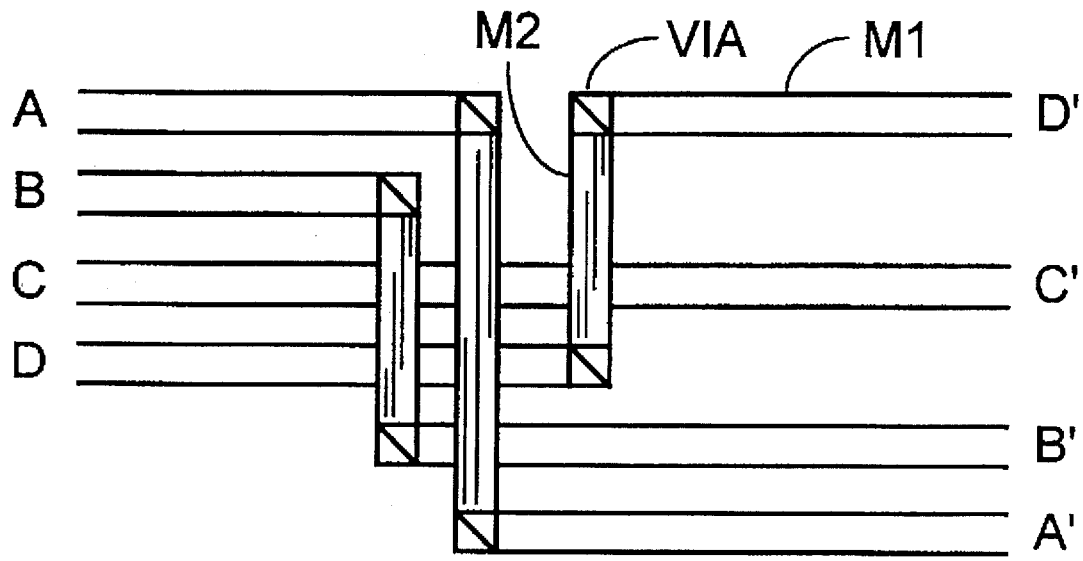
FIGS. 1A–1C are illustrations of prior art layouts of configurable blanks.
Figure 1A:
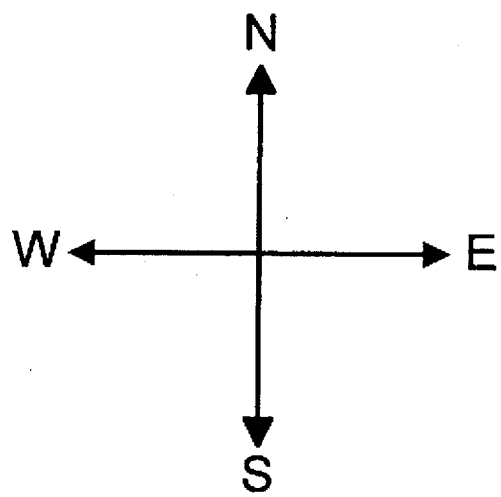
Figure 1B:
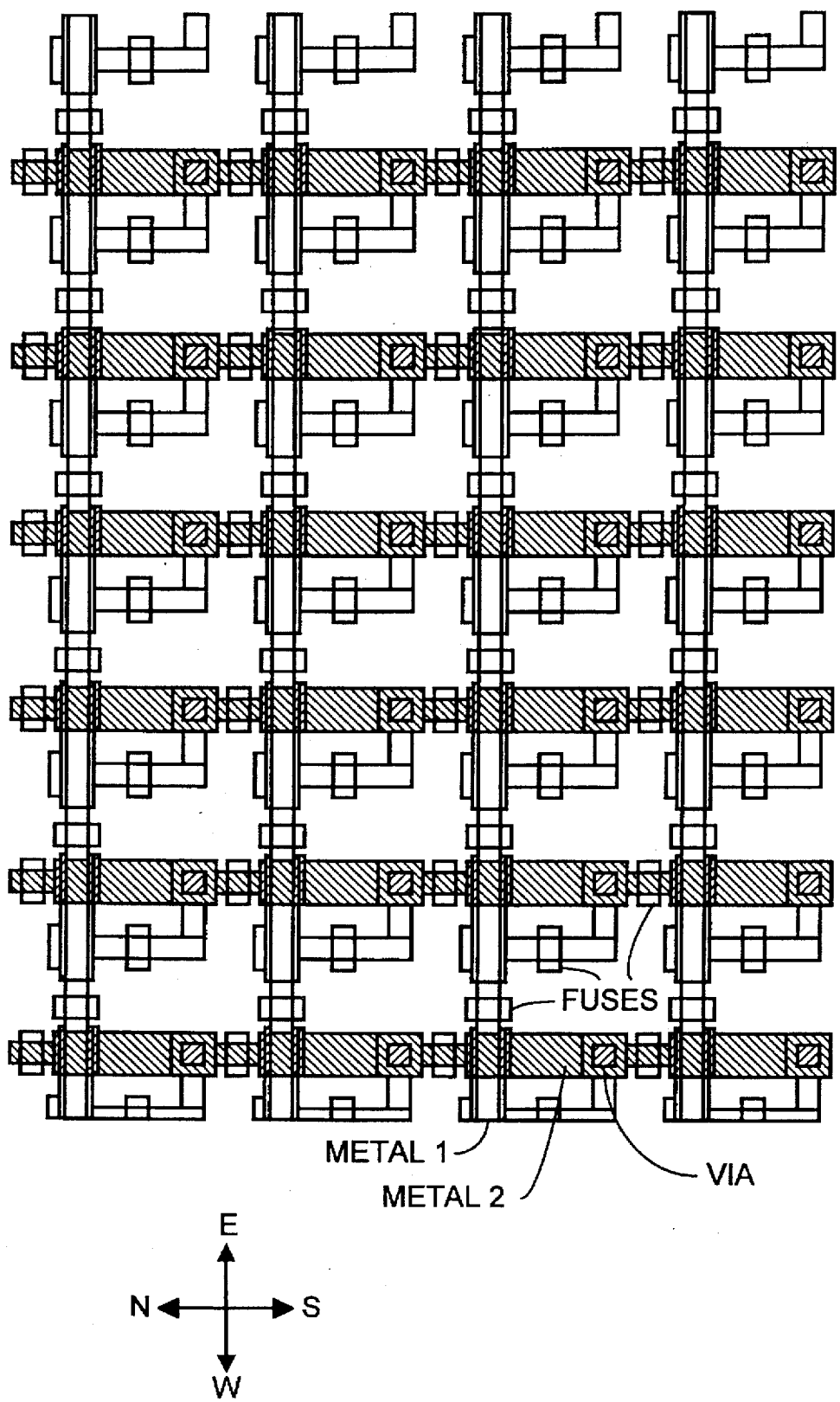
Figure 1C:
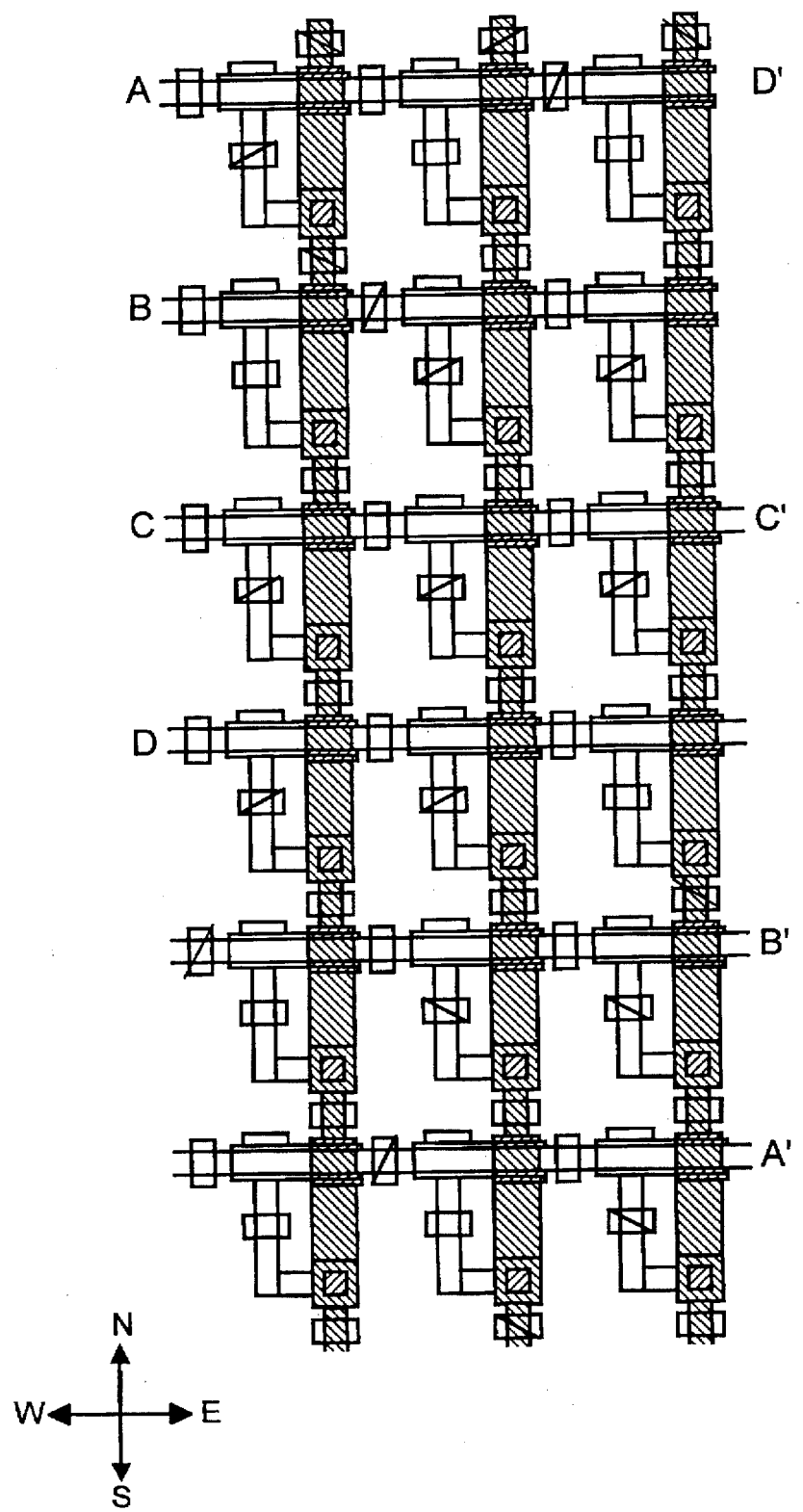

The present invention is particularly applicable to circuits such as a typical CMOS gate array device of the type illustrated in FIG. 1A of U.S. Pat. No. 4,924,287. A CMOS gate array is used as an example for the purposes of illustration herein, however, the invention is also applicable to other types of gate arrays such as, for example, BiCMOS, ECL and TTL and to the various designs of gate arrays of these types and others made by various manufacturers. The invention is also applicable to integrated circuits other than gate arrays.

A typical CMOS gate array device according to the invention includes an array of semiconductor elements which may be interconnected by at least three suitable metal layers to define the electrical function of the circuit. According to the present invention, fusible links are provided between the semiconductor elements in a manner which enables the function to be selected by the user.

Reference is made to the following copending patents and applications: U.S. Pat. No. 5,329,152; U.S. Pat. No. 5,111,273; U.S. Pat. No. 4,924,287; U.S. patent application Ser. No. 07/117,943, filed 6 Nov. 1987; U.S. Pat. No. 4,875,971; U.S. patent application Ser. No. 07/117,580, filed 6 Nov. 1987; U.S. Pat. No. 5,545,904; U.S. Pat. No. 5,049,969; and U.S. Pat. No. 4,933,738. The disclosures of these references, which are hereby incorporated herein by reference, pertain to apparatus and methods, particularly with respect to fusing, useful in some aspects of the present invention.

A device constructed according to a preferred embodiment of the present invention has three metal layers, wherein the top two metal layers have fusible links. The lower of the three metal layers is generally used for permanent non-fusible links such as links connecting transistor gates into logic cells, power lines, links connecting transistors to form permanent memory gates and other embedded functions.

It is emphasized that the invention is not limited to any particular pattern of fusible link interconnections between conductors or to any particular pattern of conductors.

Figure 2A:
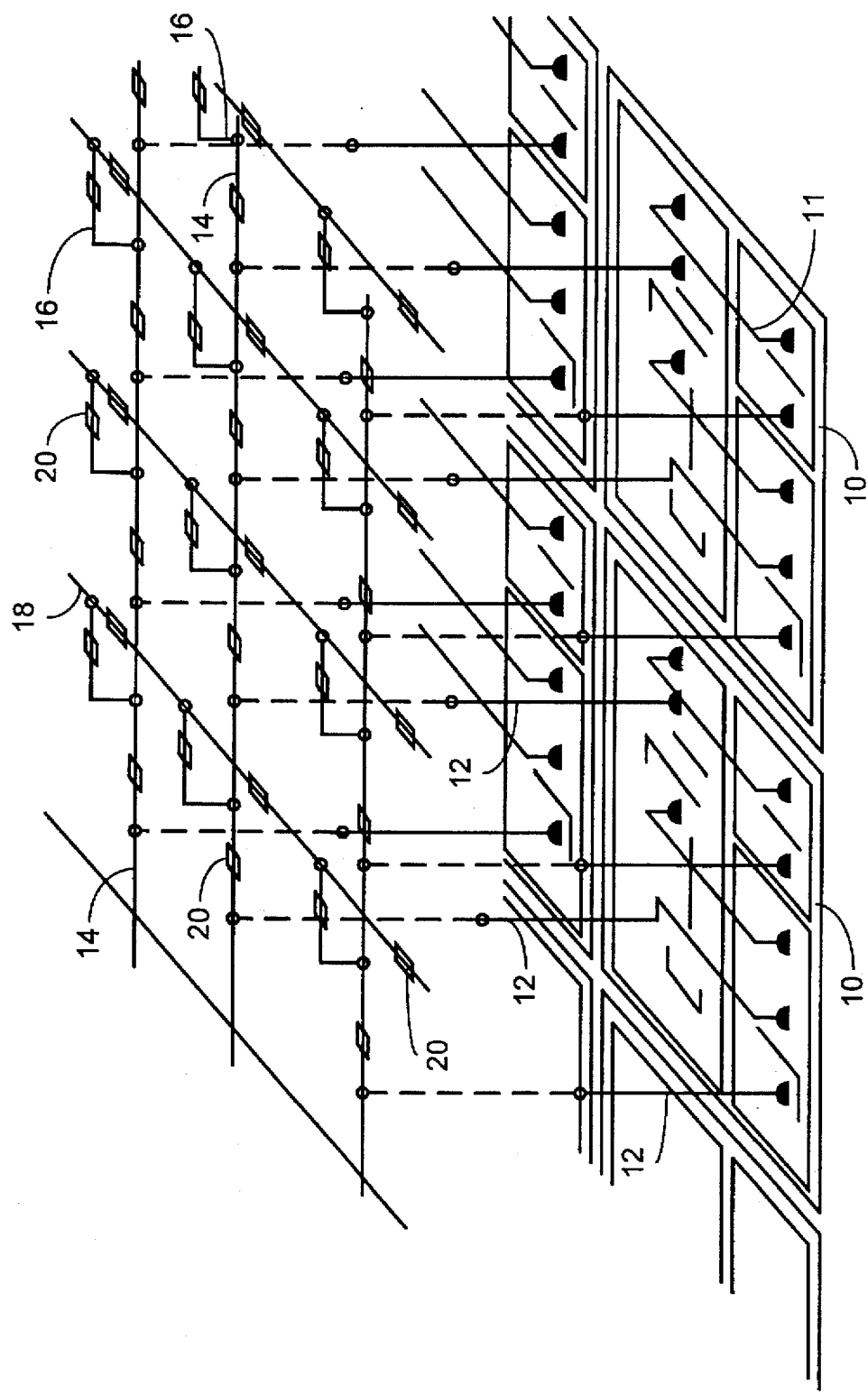
FIG. 2A is a simplified illustration of part of a customizable logic array device constructed and operative in accordance with a preferred embodiment of the present invention.

Reference is now made to FIG. 2A, which is a simplified illustration of part of a customizable logic array device constructed and operative in accordance with a preferred embodiment of the present invention.

As seen in FIG. 2A, a multiplicity of unit logic cells 10 are defined by a metal I layer 11 on a silicon substrate. The unit logic cells are characterized in that they constitute multiple input, function selectable logic cells and are preferably, although not necessarily, all identical. Any suitable type of multiple input, function selectable logic cell may be used for this purpose. Various types of such logic cells are described Numerous functions can be performed by the logic cell of FIG. 2B, depending on the selection of the various inputs. Table 1 describes eight such functions:

TABLE 1

| | INPUT SELECTION | | | | | | | FUNCTION DESCRIPTION |
| --- | --- | --- | --- | --- | --- | --- | --- | --- |
| | 101 | 102 | 103 | 104 | 105 | 106 | 107 | 108 AT OUTPUT PORT 109 |
| 1. | A | B | 0 | 0 | 0 | 0 | 0 | 0 A·B |
| 2. | A | B | 0 | 0 | 0 | 1 | 0 | C A·B·C |
| 3. | A | B | 0 | 0 | 0 | 0 | 1 | C A·B·C̄ |
| 4. | A | 1 | 1 | 0 | 0 | B | 1 | C A+B+C |
| 5. | A | B | A | 1 | B | C | 0 | 0 A·B+A·C+B·C |
| 6. | CLN | 1 | Z | D | E | 0 | CLN | PRN LATCH WITH CLEAR & PRESET |
| 7. | 0 | 0 | 0 | A | B | 0 | C | D A·B·C·D |
| 8. | B | C | C | 0 | B | 1 | 0 | A (A+B)·C | in "A Comparison of Universal-Logic-Module Realizations and Their Application in the Synthesis of Combinatorial and Sequential Logic Networks" by X. Chen et al., IEEE Transactions on Computers, Vol. C-31, No. 2, February 1982, pp. 140 et seq. as well as in the prior art documents mentioned hereinabove in the Background of the Invention. The disclosures of all of these documents are hereby incorporated herein by reference.

Coupled to various junctions (points on metal layer 11) in cells 10 by a plurality of vias 12 is a Metal II layer 14, which in turn is connected by a plurality of vias 16 to a Metal III layer 18. The metal II and metal III layers together constitute application configurable interconnections selectably interconnecting the multiple input, function selectable logic cells 10.

In accordance with a preferred embodiment of the invention metal II and metal III layers 14 and 18 include a multiplicity of radiation selectable fuses 20. The term "fuse" is used throughout to refer to an electrically conductive link which is selectably disconnectable by local impingement of radiation or etchants having predetermined characteristics. Preferably the fuses 20 are disconnectable by laser radiation.

Techniques for laser disconnection of fuses are described inter alia in applicant/assignee's U.S. Pat. Nos. 4,924,287 and 5,111,273, the disclosures of which are hereby incorporated herein by reference.

Further in accordance with a preferred embodiment of the invention, fuses 20 of layers 14 and 18 may be removed by a masking and etching method wherein the fuses are coated with a radiation sensitive resist. Preferably the radiation is visible blue light. Alternatively, the following types of radiation inputs may be employed: UV, X-ray, electron beam and ion beam. In this method, the fuses are coated by a radiation sensitive resist layer and the resist layer is locally exposed in a selective manner to the radiation thereby selecting those fuses to be removed. After resist development, the exposed fuses are removed by chemical or reactive ion etching.

Figure 2B:
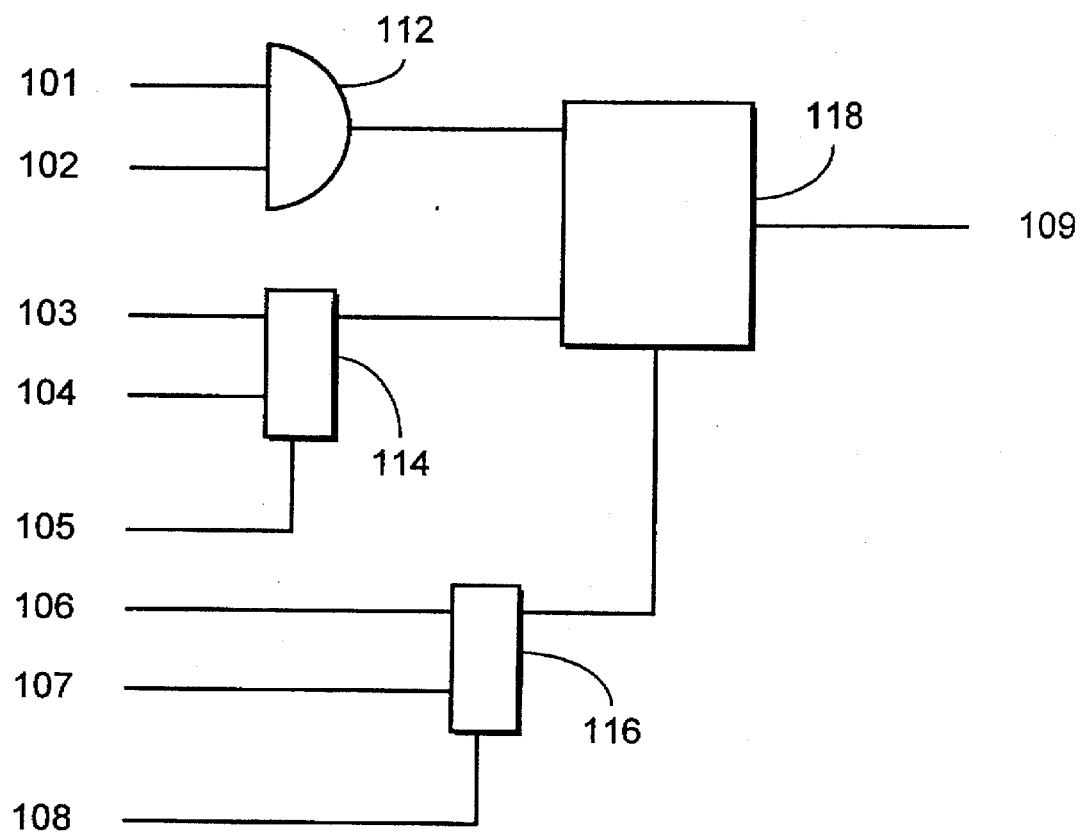
FIG. 2B is a schematic illustration of a preferred logic cell for use in the customizable logic array device of FIG. 2A.

Reference is now made to FIG. 2B, which schematically illustrates a preferred logic cell for use in the customizable logic array device of FIG. 2A. The cell of FIG. 2B comprises four cells, an AND gate 112, first and second selectors 114 and 116 and a third selector 118. The AND gate and the first and second selector receive inputs 101, 102, 103, 104, 105, 106, 107 and 108 and are connected to the third selector 118 as shown. The third selector has an output port 109.

Figure 3A:
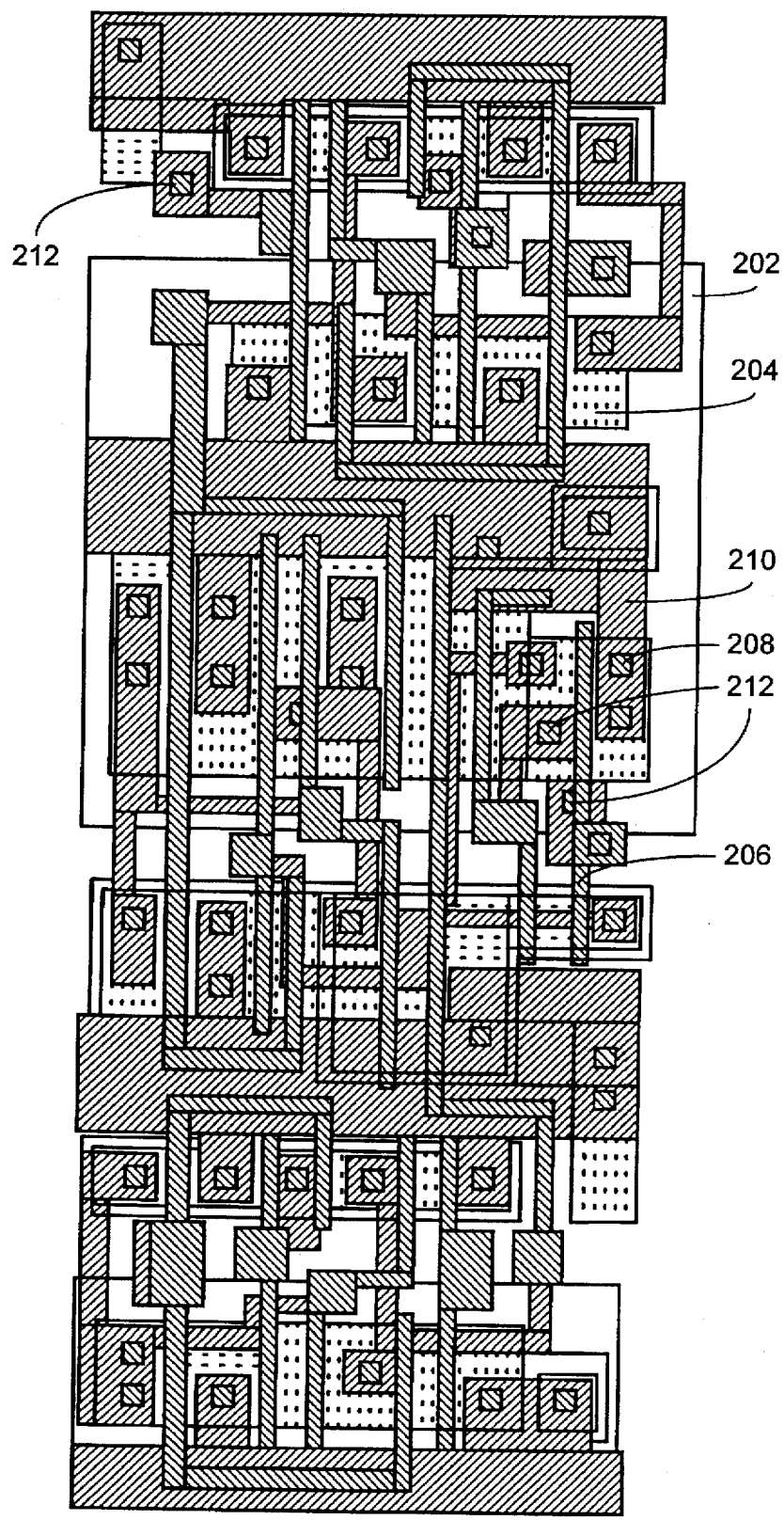
FIGS. 3A and 3B are two examples of layouts of preferred function selectable logic cells for use in the customizable logic array device of FIG. 2A.
Figure 3B:
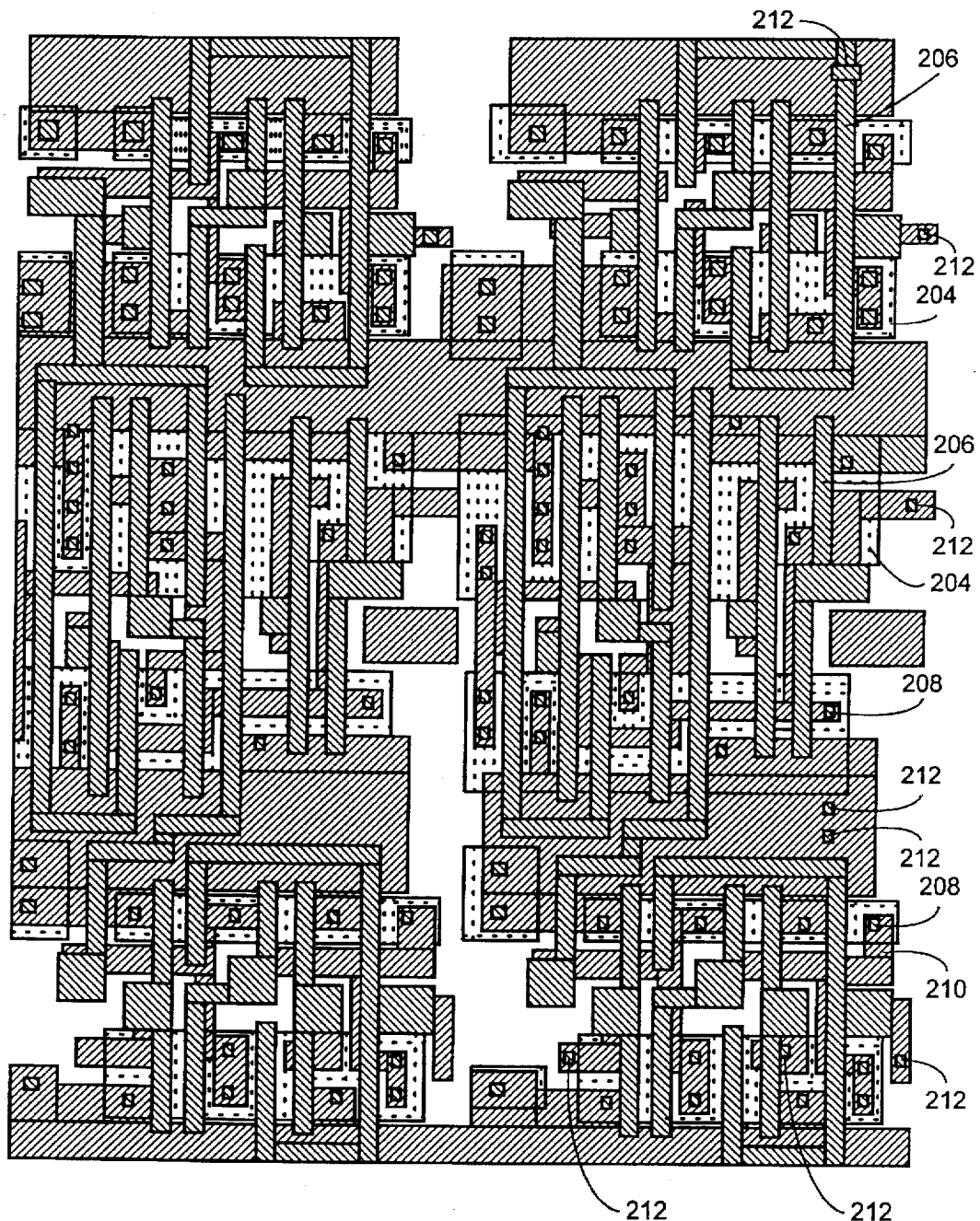

Reference is now made to FIGS. 3A and 3B which are two examples of preferred architectures of logic cells useful in the customizable logic array device of FIG. 2A. The logic cells are implemented in a CMOS structure with a reference 202 indicating a well, a reference 204 indicating implant regions, a reference 206 indicating the polysilicon gates, a reference 208 indicating the contacts; a layer 210 being metal I and a reference 212 indicating a plurality of vias which connect metal I layer 210 to the upper interconnect layers.

Preferably neither polysilicon gate layer 206 nor metal I layer 210 is customizable and the function of the logic cell is solely determined by selecting the inputs to the various vias 212. Generally, the polysilicon gates have different sizes, optimized for their particular roles in the logic cells.

Figure 4A:
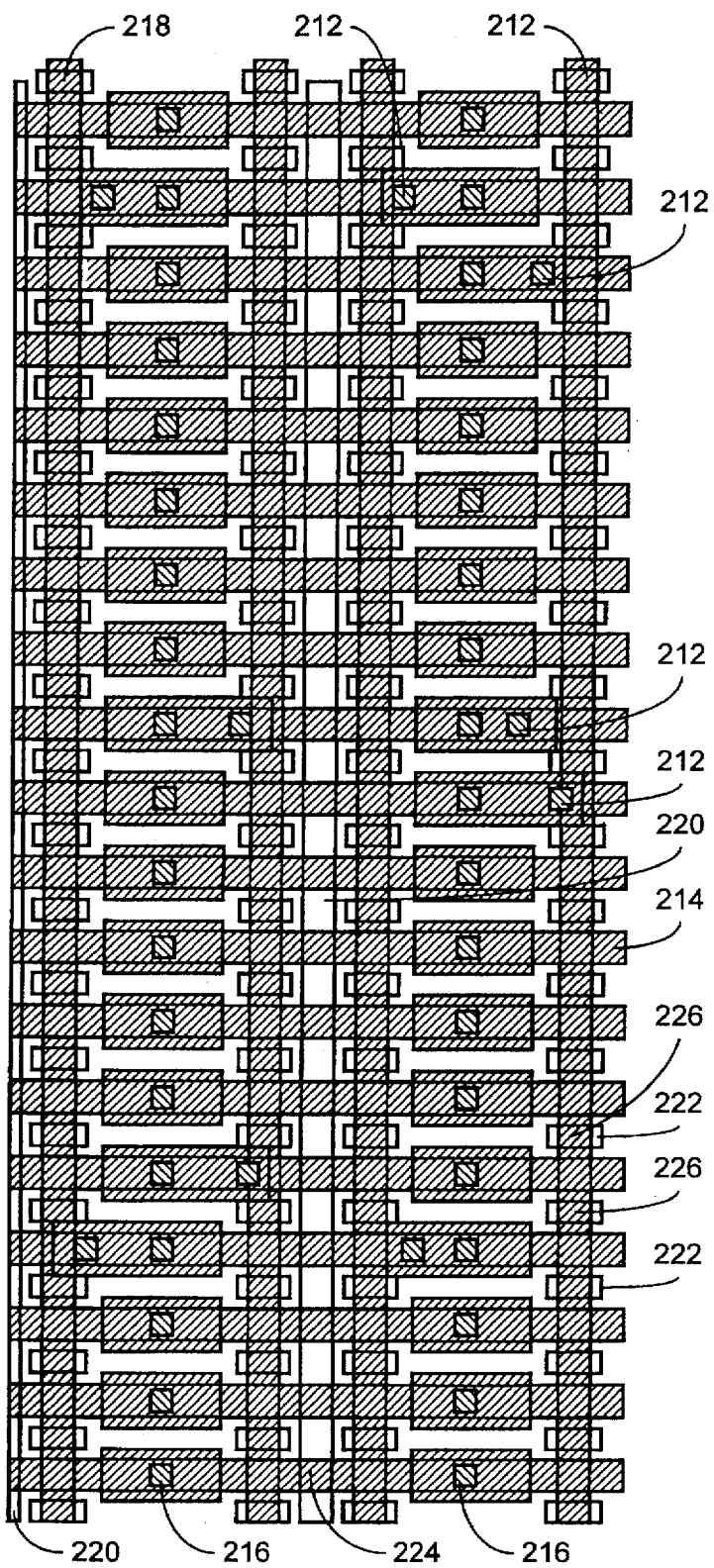
FIGS. 4A and 4B are two examples of preferred routing architectures useful in the customizable logic array device of FIG. 2A for use with the respective cells illustrated in FIGS. 3A and 3B.
Figure 4B:
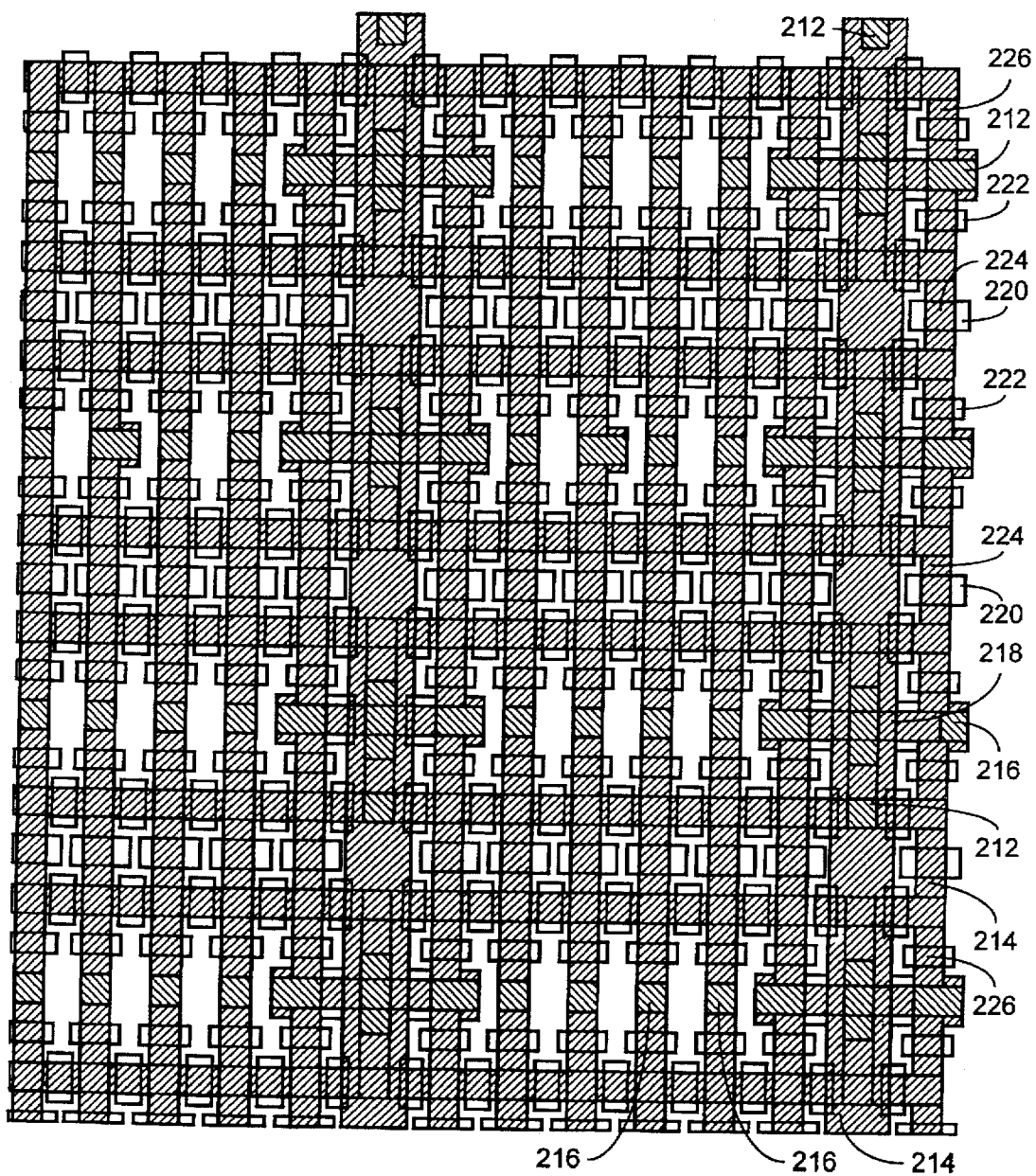

Reference is now made to FIGS. 4A and 4B which are two examples of preferred routing architectures corresponding to the logic cells shown in FIGS. 3A and 3B respectively.

The routing structure comprises two metal interconnect layers, namely metal II indicated by reference numeral 214 and metal III indicated by reference numeral 218. The metal II and metal III layers are generally arranged as mutually perpendicular arrays of strips which extend in mutually parallel planes. Branches are formed in the metal III layer which lead to connections to the metal II layer at selected locations by vias 216. The metal II layer is connected to the metal I layer and the logic cells therebelow by means of vias 212.

Rectangles 220 and 222 which are shown covering the fuses 224 and 226 of the metal II and metal III layers respectively indicate the areas to which radiation should be directed in order to break the fuses or prepare them for etching during customization of the array.

Figure 7A:
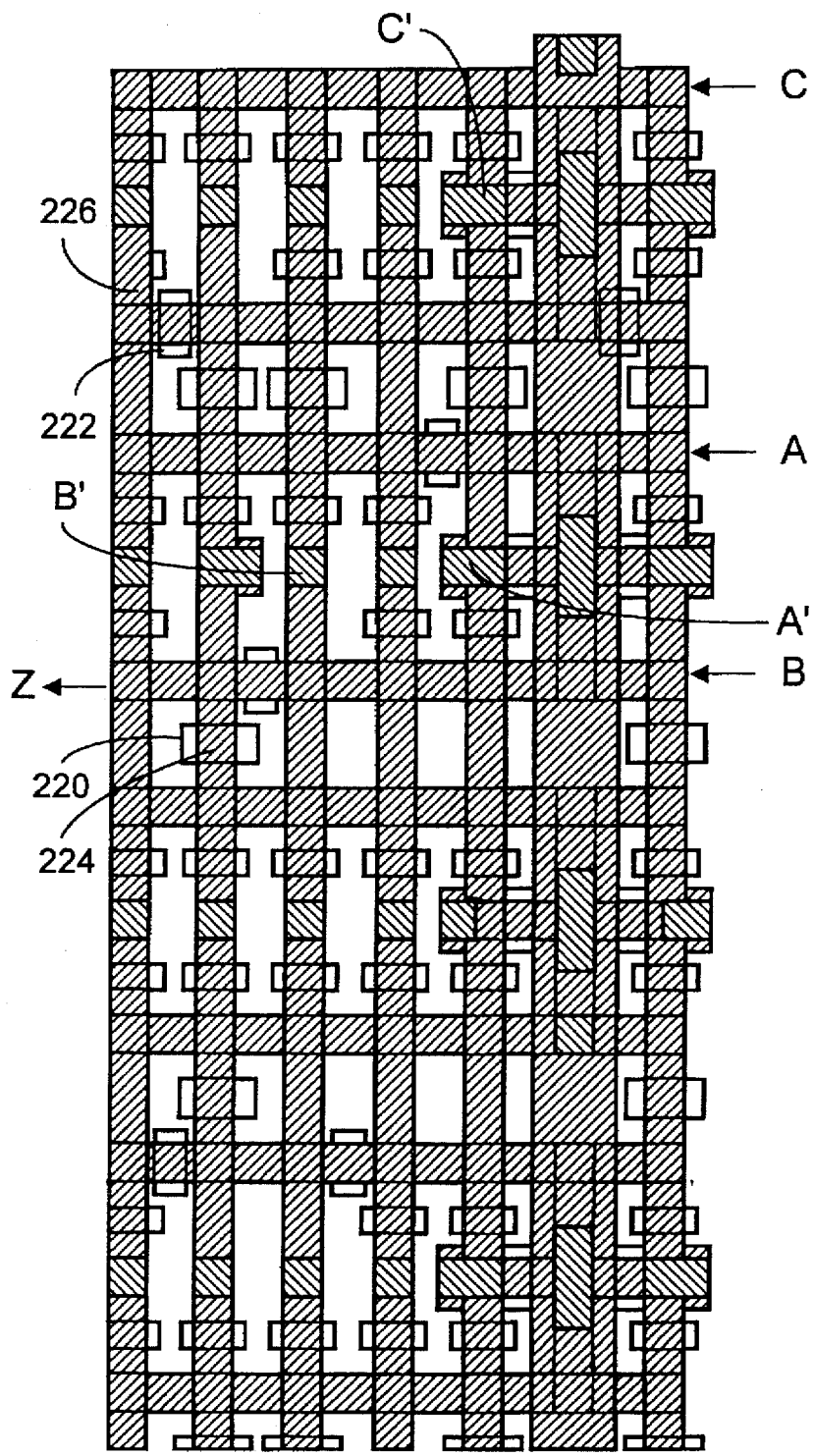
FIG. 7A is an illustration of the routing architecture shown in FIG. 4B wherein a selection of fuses is made.
Figure 7B:
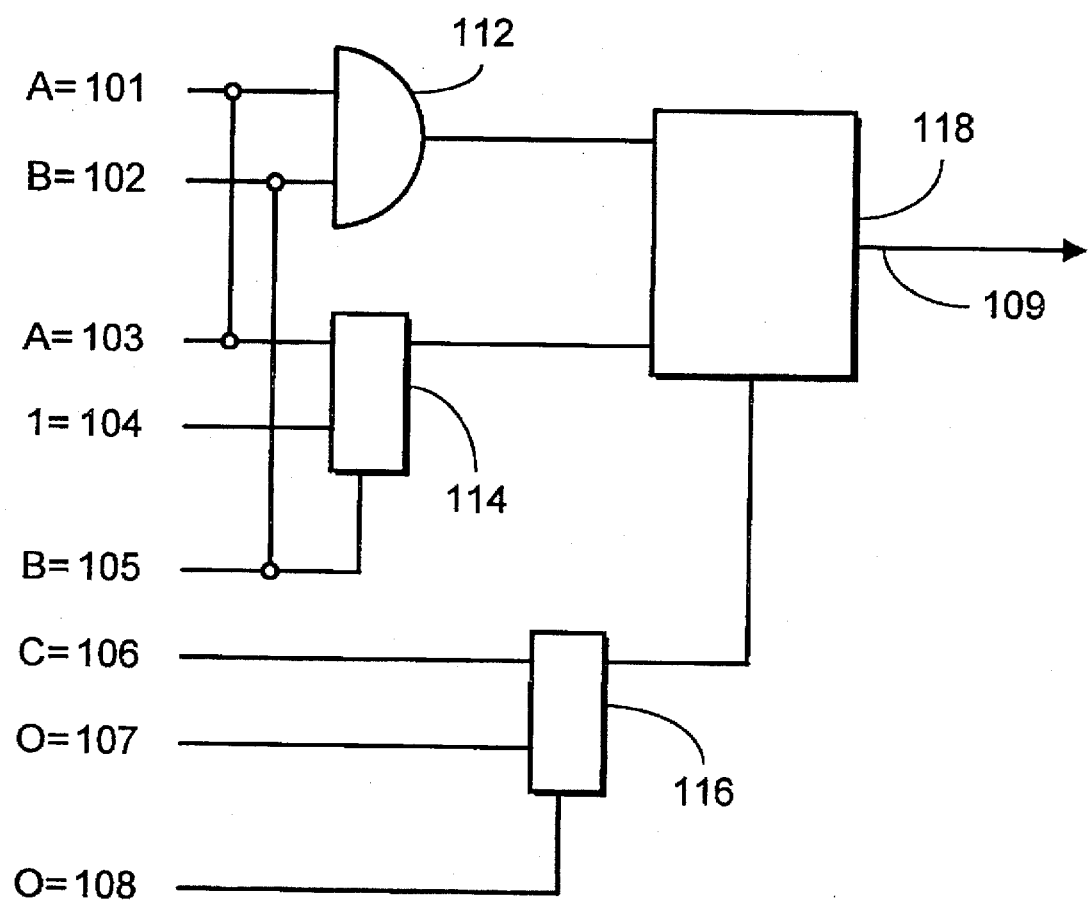
FIG. 7B is a schematic illustration of the resultant electronic functionality of the embodiment of FIG. 7A.
Figure 8A:
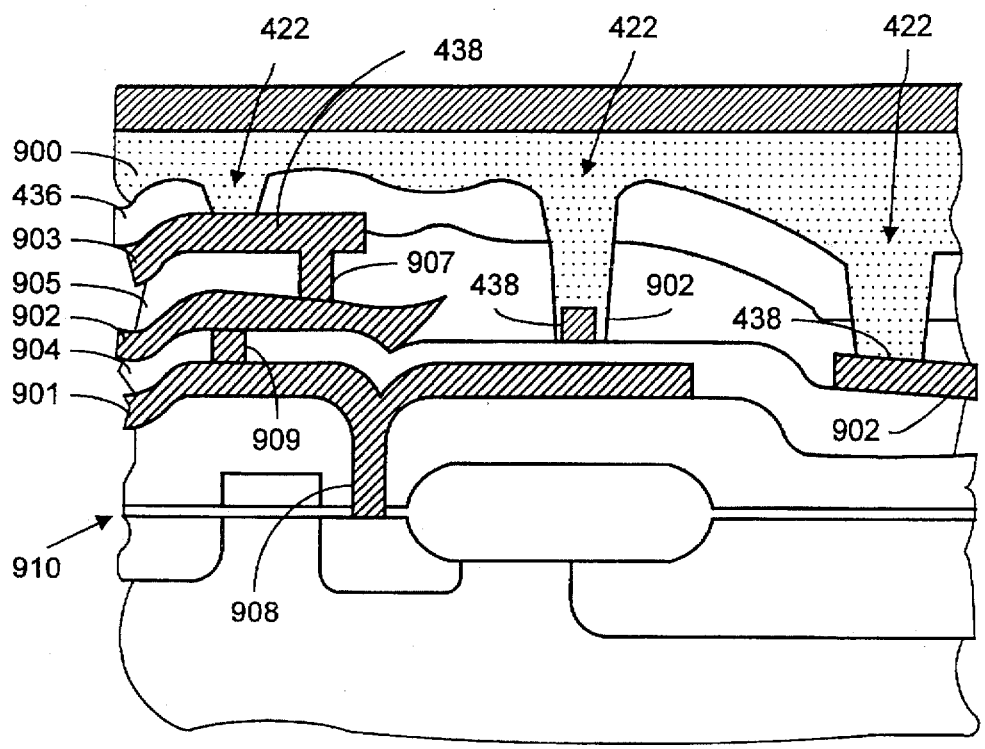
FIGS. 8A–8D show an additional method of customization according to another preferred embodiment of the invention.
Figure 8B:
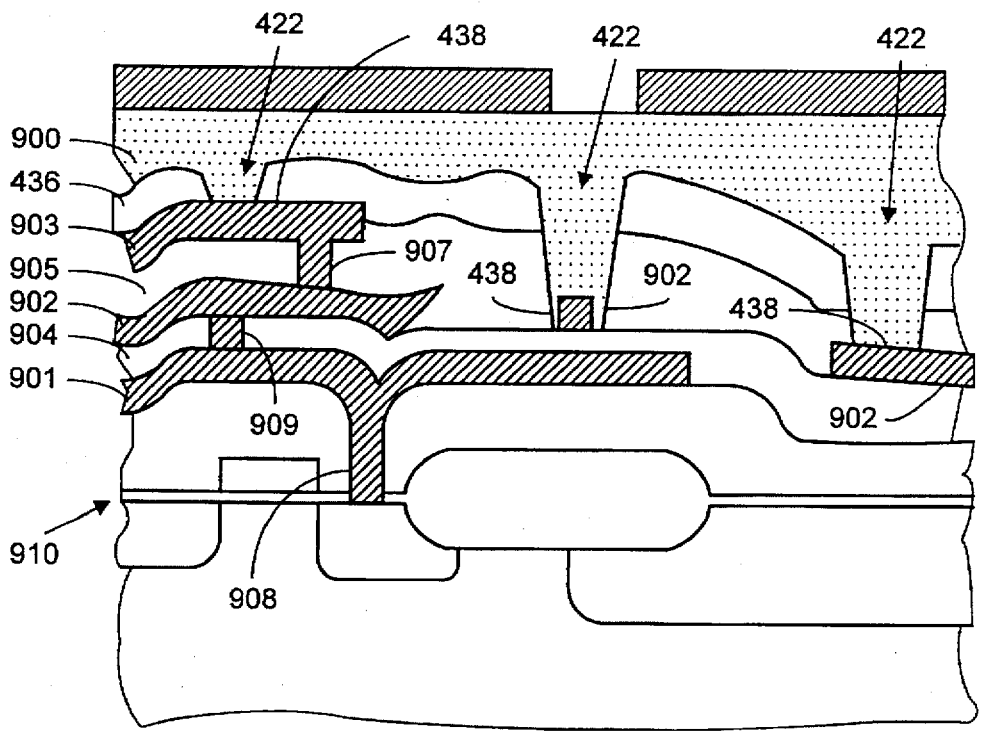
Figure 8C:
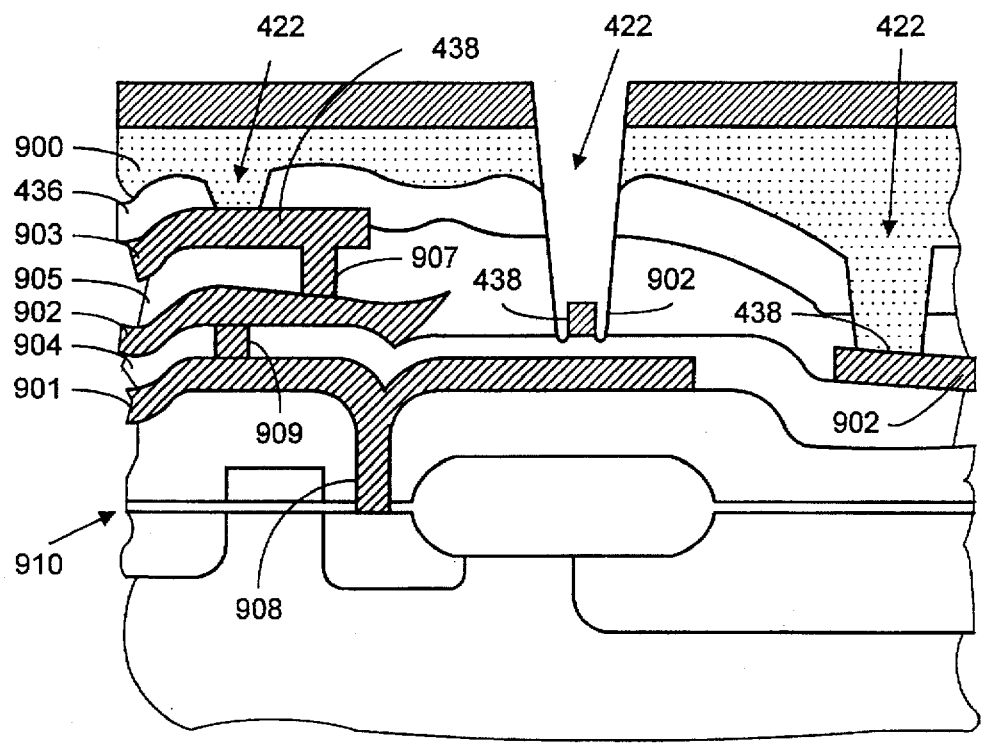
Figure 8D:
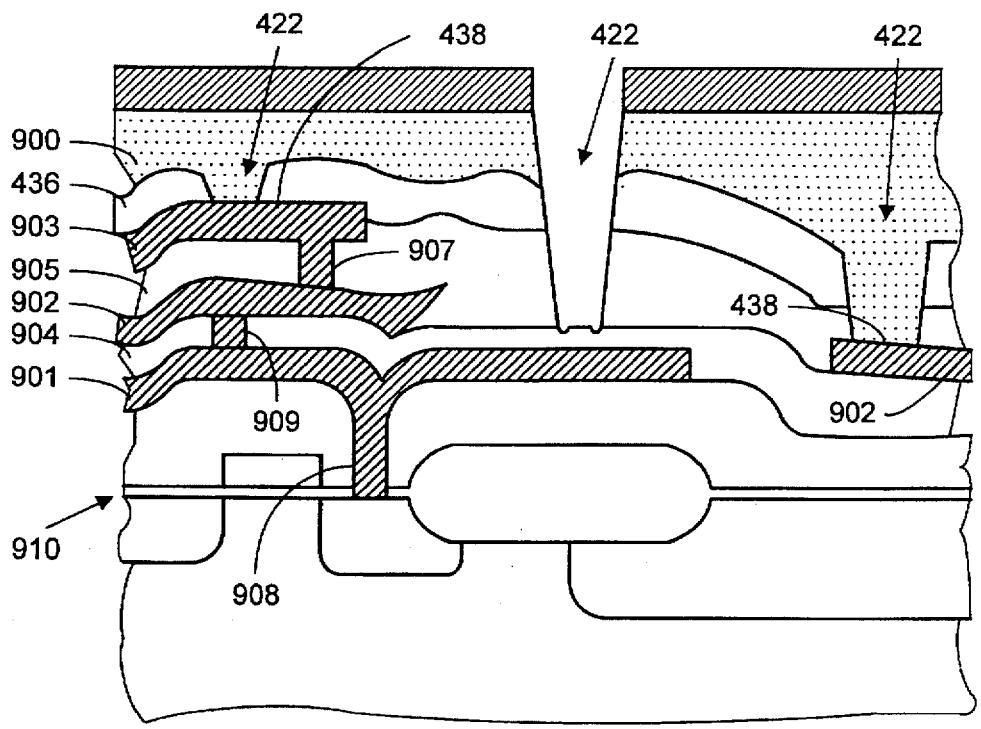

Reference is now made to FIGS. 7A–7B. FIG. 7A shows a specific case of the disconnection of fuses which implements example No. 5 of Table 1 in the logic cell of FIG. 3B. Fuses 224 and 226 and other fuses which are cut are marked by rectangles while all other fuses are unmarked. Inputs A, B and C are supplied through the metal II layer as shown and they are connected to the logic cell through vias indicated as A', B' and C'.

FIG. 7B is a schematic illustration of the embodiment of FIG. 2B, performing the selected function No. 5 of Table 1, by virtue of being customized as indicated in FIG. 7A. Preferably the device which comprises the function selectable logic cells and the customizable routing structure contains other electronic cells such as I/O cells, drivers and memory modules which are connected to the cells modules by the routing structure.

It is a particular feature of the present invention that the various layers are configured such that the top two metal layers are always exposed for etching at locations where removal thereof may be desired to produce fusing. This is seen from a consideration of FIGS. 4A and 4B which show a multiplicity of fusible links all of which are not covered by another metal layer.

Fusible links 20, 224 and 226 are generally referred to herein as "the fusible links". A general fusible link is sometimes indicated on the drawings herein by reference number 438.

Further in accordance with a preferred embodiment of the present invention, at least some of the fusible links are arranged such that they cannot be fused by means of providing electrical current through the external connections of the integrated circuit. No such electrical connections are provided for that purpose. Thus, all the fusible links are adapted for fusing by application of energy locally to the links themselves or in their vicinity. Obviating the need for electrical connections for fusing greatly simplifies the design and increases the circuit density of integrated circuits.

The fusible links may have several different functions. Although the preferred embodiments described the use of the links as "interconnection" (routing) links, which serve to join individual cells in a predetermined order to provide a desired multiple cell function, in other preferred embodiments the links serve as "substructure" links which join semiconductor elements to define functions of individual logic gates and logic cells. Several links can be connected in parallel, so that the current carrying capacity of the links is increased.

Figure 5A:
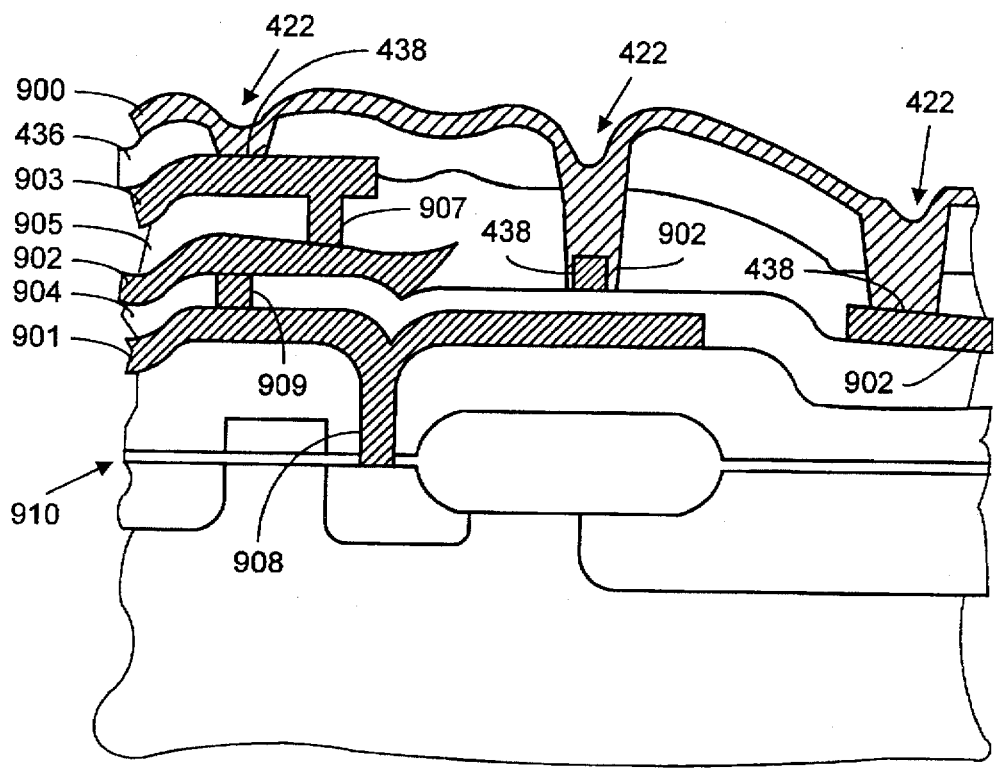
FIGS. 5A–5C are illustrative sectional views representing the various stages of a method according to a preferred embodiment of the present invention.
Figure 5B:
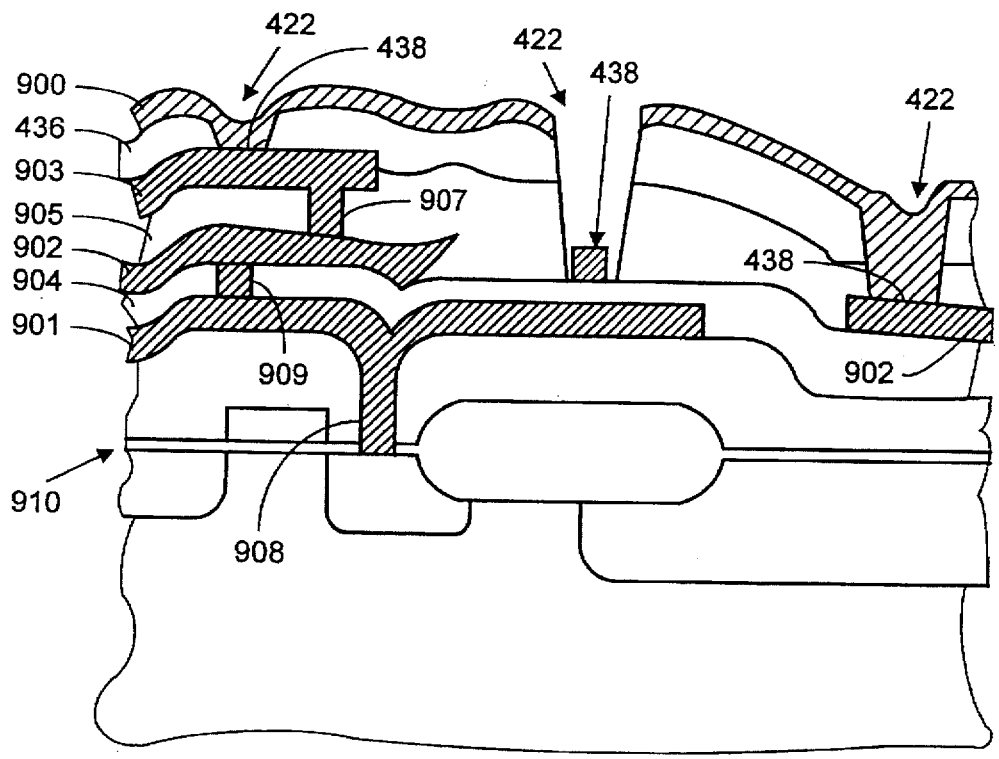
Figure 5C:
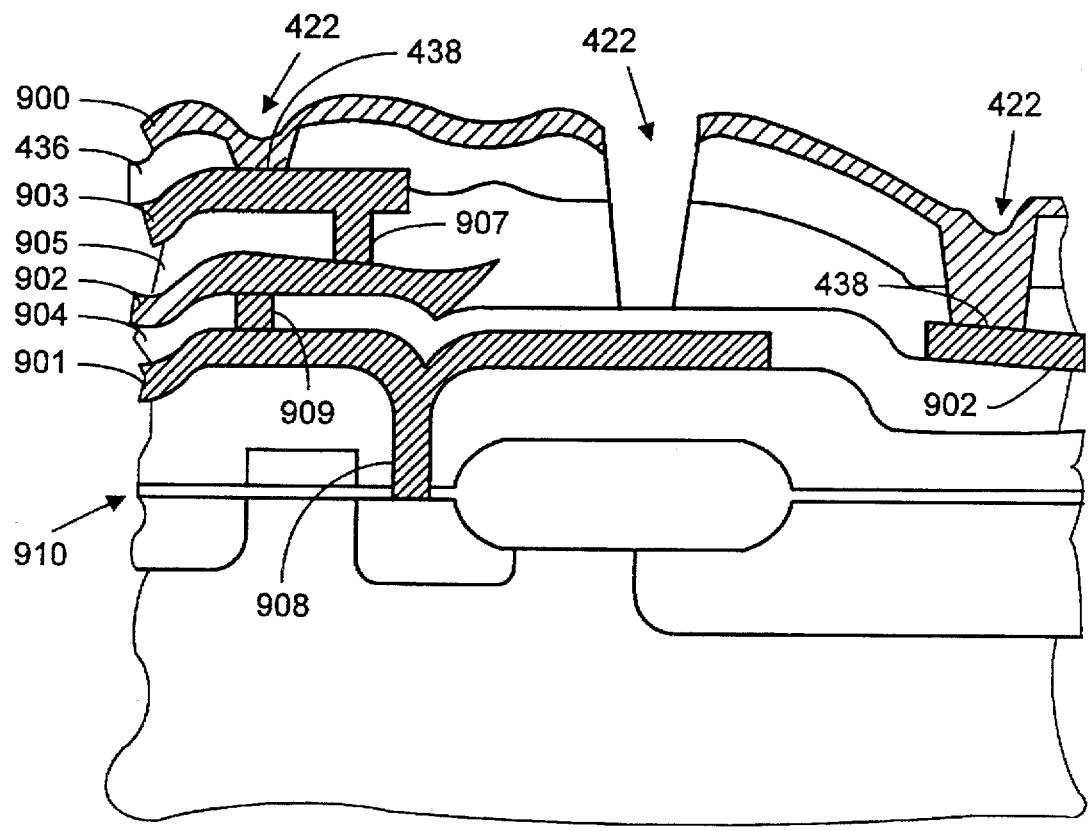

A method according to a preferred embodiment of the present invention will now be described with particular reference to FIGS. 5A-5C. FIG. 5A shows, in cross-section, a configuration characteristic of an integrated circuit blank which is ready for customization to a specific configuration according to a preferred embodiment of the invention. A first metal layer 901 is provided over a substrate covered with a plurality of semiconductor elements with active areas 910. A plurality of contacts 908 connect layer 901 with active areas 910. Metal layer 901 is covered with an insulation layer 904, which is itself covered by a second metal layer 902. A plurality of vias 909 connects layer 901 to layer 902. Metal layer 902 is covered by a second insulating layer 905, which is itself covered by a third metal layer 903. A plurality of vias 907 connect layer 902 with layer 903. Metal layers 903 and 902 have fusible link locations 438. A passivation layer 436 is optionally provided over the circuit. Apertures 422 are then formed over the fusible links 438 in all of the metal layers. In FIG. 5A a radiation sensitive etch-resistant layer 900 is shown covering the circuit, as described in step 1 below. In a preferred embodiment, apertures 422 reach down to the second metal layer 902, and only layer 900 protects the links at the fuse locations 438. Preferably layer 900 serves as a short term passivation layer.

Customizable devices built according to preferred embodiments of the invention can be customized in several ways, including, by fusing links with laser beams and by etching links.

Customizing typically comprises the following steps:

1. Covering a semiconductor device, as described herein, having apertures 422 formed therein, with a radiation sensitive coating 900. Preferably, the radiation sensitive coating is laser ablative, such as described in U.S. Pat. No. 5,329,152. (FIG. 5A)

2. Exposing the device, at areas above designated fuse locations, to a radiation source, preferably a laser or an electron beam, to remove coating 900. (FIG. 5B)

3. Etching the device. The ablated locations are etched, and the underlying link portions severed. (FIG. 5C)

Alternatively, the designated fuse locations may be fused directly by laser.

Alternatively, apertures 422 are formed only after step 2, in which case, an additional step of etching apertures 422 at locations wherein layer 900 was removed, is required before severing the links (step 3).

FIGS. 8A–8D show an alternative method wherein the surface of the device is planarized before being covered with a laser ablative coating, preferably, the planarizing material is silicon dioxide. Planarization is usually preformed so that it is easier to focus the laser at a uniform depth of ablative coating 900. After ablating coating 900, the planarization layer 906 underlying the ablated locations is removed. Preferably, the removal is achieved by etching the device in a plasma of $CF_4$.

Alternatively, radiation sensitive coating 900 is a standard photoresist coating, an e-beam resist coating or an X-ray resist coating; the coating is exposed to radiation through an application specific mask; and the device is etched to remove the fuses at the locations exposed.

Applying these methods to a semiconductor device with three or more metal layers is not trivial. In this configuration, it is difficult to open an inter-oxide aperture 422, which reaches down to metal layer 902, without damaging (by etching) the oxide layer 904 and penetrating down to the layer 901.

The difficulty stems from engineering constraints. In principle, it is possible to control the etching of the apertures so that layer 904 will not be damaged. In practice, cumulative inaccuracies force the use of over etching. Over etching is etching for a longer time than absolutely necessary in order to verify that all the oxide that was supposed to be removed, was actually removed. When there are only two metal layers or when only the top metal layer is etched, there are smaller cumulative errors, and it is easier to control the etching of the upper two metal layers, without penetrating to underlying layers of the device. If the oxide layer 904 is damaged, layer 901 or active areas 910 may be unintentionally damaged during the customizing of the device.

Additionally, fusing and etching links in layer 902 may damage the links in layer 901 or the active areas 910 even if oxide layer 904 was not damaged, again, because of accumulated inaccuracies that necessitate over etching or longer fusing times.

There are several preferred solutions to these difficulties.

A first preferred solution is the use of extra wide links in layer 901, at least below designated fuse locations in layer 902. For this configuration, at most, a portion of the wide link will be damaged. Preferably, in locations not underlying fusible links, the links in layer 901 are of a minimum design rule width (MDR), described below. Alternatively, the entire length of the links in layer 901 is made wider than MDR.

Figure 6A:
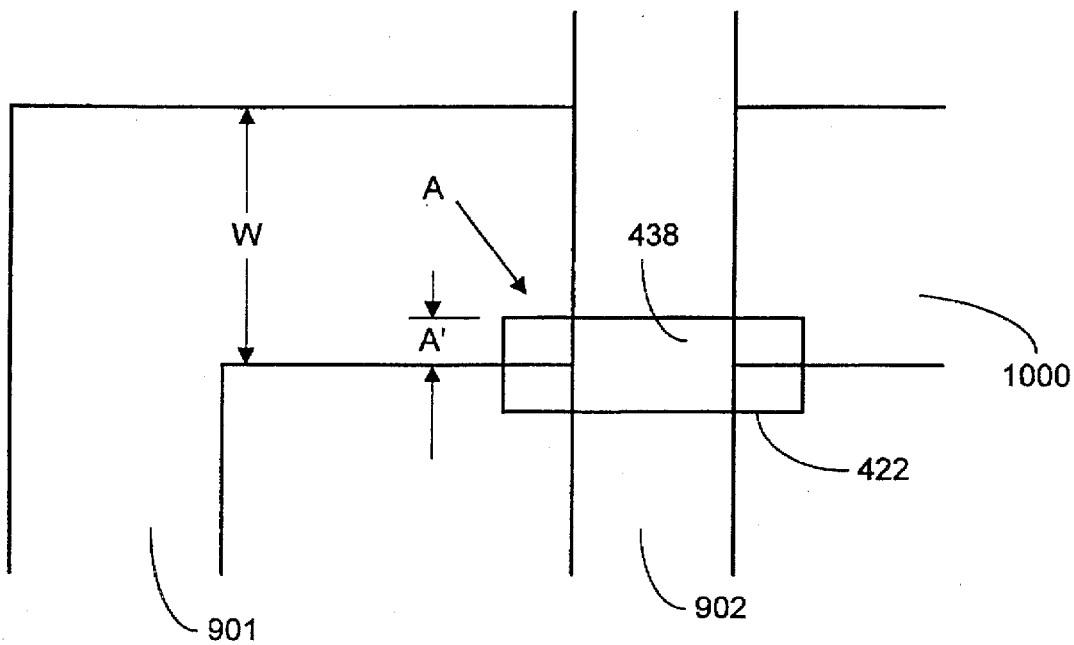
FIGS. 6A–6B illustrate various configurations of fuses over metal lines in accordance with preferred embodiments of the invention.
Figure 6B:
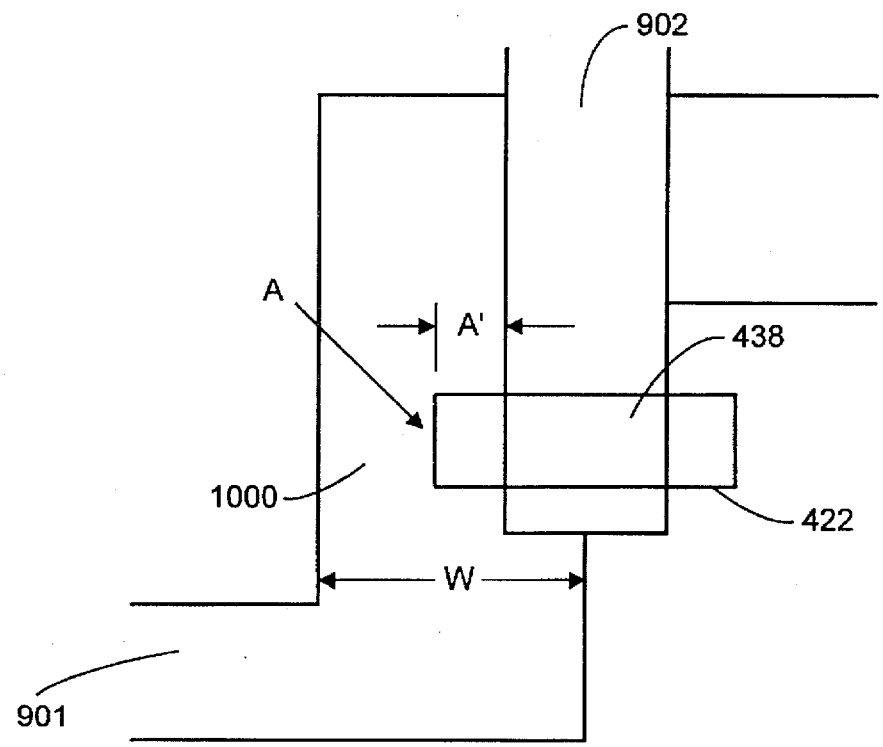

FIGS. 6A and 6B show two possible configurations for aperture 422 and a wide link 1000, the width being defined by W. FIG. 6A shows the case where fusible link 438 is perpendicular to the current flow direction of link 1000; FIG. 6B shows the case where fusible link 438 is parallel to the current flow direction in link 1000. A is the overlap portion of aperture 422 and link 1000 which is not obscured by the metal of link 438 and A' is the magnitude of A in the direction perpendicular to the current flow in link 1000. In both configurations, width W of link 1000 is large enough so that when a portion of size A' is cut out of it, the remaining width W-A' is at least MDR, wherein MDR is the minimum design rule for the width of current carrying metal links in the layer in which link 1000 is located. Preferably, link 1000 is of constant width, alternatively, link 1000 is of width W only in locations underlying fusible links 438. Typically the MDR is between $0.5\mu$ and $1\mu$ and A is between $0.1\mu$ and $1.6\mu$ so that W is typically between $0.6\mu$ and $2.6\mu$.

In a second preferred solution, oxide layer 904 is preferably made thick enough so that the etching of the apertures 422 does not penetrate to underlying layer 901. When laser customization is used, layer 904 is made thick enough so that the laser energy does not damage the underlying layer. When the method of customization is etching, layer 904 is made thick enough to withstand the etchant. Preferably, the thickness of oxide layer 904 is at least 4000 angstrom. Preferably, the thickness of oxide layer 904 underlying fuses 438 is increased by adding dummy structure surrounding link 1000 so that a pile-up of oxide will occur underlying said fuse locations during the formation of layer 904.

In a third preferred solution, layers 901 and 902 are made of different materials, so that each layer is sensitive to a different etchant. Preferably, layer 902 is composed predominantly of aluminum and layer 901 is composed of tungsten.

In a fourth preferred solution, layer 901 is made thicker than usually required, so that when layer 902 is etched, not all the thickness of layer 901 will be etched through. Preferably layer 901 is at least 1.3 times as thick as layer 902. Preferably layer 901 is of a constant thickness.

In a fifth preferred solution, layer 901 has non-active metal pads underneath the locations of the links in layer 902. These metal pads act as etch-stops, during etching of apertures 422.

Layer 901 can be designed so that there are no designated fuse locations in layer 902 directly above active links in layer 901, and no designated fuse locations in active links in layer 903 directly above layer 902. However, such designs generally require more area to carry out the same function.

It is appreciated that joint application of the above mentioned solutions are also possible.

According to some embodiments of the present invention, apertures 422 (and the respective links) are laid out in a way that allows mass production of relatively general purpose integrated circuit blanks, and customization thereof by fusing fuses underlying some of the apertures. It is a particular feature of the present invention that a plurality of metal layers, in a three metal layer structure, can be etched simultaneously. This feature arises since the etchable locations are all exposable at once, even though they are in different metal layers.

In the present invention, fusible metal link locations may be situated over the device's active areas 910 such as transistors, implant regions and polysilicon or MOS gates. When fusing above active areas a differentiation is made between areas of different sensitivities. A first type of area, comprising most of the implant regions, is relatively insensitive to damage. Fusing links overlying the first type of area is preferably preformed using the methods and structures described herein. However a minor amount of damage to the first type of area is tolerable, especially if the area is robust, for example, an implant area. Current carrying links are similarly relatively insensitive to damage. A second type of area, comprising portions of gates overlying gate-oxide, is relatively sensitive to damage. Gate-oxide is a very thin layer, typically 10 nanometers, which is easily damaged when creating apertures 422 and when fusing links 438, especially when etching by plasma etching. Since damage to gate-oxide can not be tolerated in an operating customized device, special care is taken when fusing links overlying gate-oxide. Preferably, most fusible links are not located over gate-oxide. It is appreciated that a single implant region may have one portion which is insensitive to damage and a second portion which is very sensitive to damage, such as the area near the gate. In any case, fusing of links above areas which are not active in the customized device is optionally preformed without the application of special structures described herein.

Ablation of ablative coating and direct cutting of metal fuses is preferably, but not necessarily, preformed using a QS650 laser micromachining device available from Chip Express (Israel) LTD.

It will be appreciated that the layers referred to hereinabove as metal layers need not, in fact, be made specifically of metal, but rather may be formed from any suitable electrically conducting material. Additionally, the methods and structures described herein are useful in devices comprising more than three metal layers.

It will be appreciated by persons skilled in the art that the present invention is not limited by what has been thus far described. Rather, the scope of the present invention is limited only by the following claims:

We claim:

1. A customizable integrated circuit device comprising:
   a substrate;
   a plurality of transistors provided on said substrate;
   at least three interconnected metal layers, separated by layers of insulation; and
   a plurality of links connecting the transistors into an inoperable circuit, said plurality of links having designated fuse locations in at least two of said three metal layers, said plurality of links and transistors being arranged such that, upon disconnecting of selected ones of said plurality of links at certain of said designated fuse locations, said plurality of links and transistors is interconnected into an operable circuit, wherein said fuse locations are not selectively fusible by current supplied at accessible input/output pins of the device.

2. A device according to claim 1, wherein a layer of radiation sensitive coating is provided over at least one of said metal layers.

3. A device according to claim 2, where said radiation sensitive coating is laser ablative.

4. A device according to claim 1, wherein a link which carries current in the operable circuit that:
   (a) is located in the lowest one of said three metal layers; and
   (b) is located beneath a designated fuse location in the center one of the three metal layers, said fuse having an overlying aperture;
is at least as wide as MDR+A', where
   (i) MDR is the minimum allowable width of metal signal lines in the lowest of the three metal layers; and
   (ii) A' is the size of a portion A perpendicular to the current flow direction in said link, wherein A is the portion of said aperture which overlies said link and is not obscured by metal from the center one of said three metal layers.

5. A device according to claim 1, wherein none of the links belonging to said plurality of links in the first metal layer underlies a designated fuse location in the center one of said three metal layers.

6. A device according to claim 1, wherein etch stops are formed in the lowest one of said three metal layers underneath the designated fuse locations in the center one of said three metal layers.

7. A device according to claim 1, wherein the insulation layer over the lowest metal layer has a sufficient thickness such that etching or laser cutting of links on the center one of said three metal layers will not penetrate through the insulation layer.

8. A device according to claim 7, wherein the insulation layer is thicker than 4000 angstrom.

9. A device according to claim 1, wherein the insulation layer over the lowest of the three metal layers has a sufficient thickness such that etching apertures overlying fuse locations designated in the center one of said three metal layers will not penetrate through to the lowest of the three metal layers.

10. A device according to claim 9, wherein the insulation layer is thicker than 4000 angstrom.

11. A device according to claim 1, wherein the lowest one of said three metal layers and the center one of said three metal layers are selectably etchable by different etchants.

12. A device according to claim 1, wherein at least one of said designated fuse locations is located over one of said transistors.

13. A device according to claim 1, wherein at least one of said designated fuse locations is located over a portion of an active semiconductor element.

* * * * *